(12) United States Patent
Kuekes et al.

(10) Patent No.: US 7,402,531 B1
(45) Date of Patent: Jul. 22, 2008

(54) METHOD FOR SELECTIVELY CONTROLLING LENGTHS OF NANOWIRES

(75) Inventors: Philip J. Kuekes, Palo Alto, CA (US); Theodore I. Kamins, Palo Alto, CA (US)

(73) Assignee: Hewlett-Packard Development Company, L.P., Houston, TX (US)

(*) Notice: Subject to any disclaimer, the term of this patent is extended or adjusted under 35 U.S.C. 154(b) by 21 days.

(21) Appl. No.: 11/297,900

(22) Filed: Dec. 9, 2005

(51) Int. Cl.
    H01L 21/461  (2006.01)
(52) U.S. Cl. ..................................... 438/755
(58) Field of Classification Search ................. 438/755; 216/2; 257/19; 117/40
    See application file for complete search history.

(56) References Cited

U.S. PATENT DOCUMENTS

| | | | |
|---|---|---|---|
| 6,248,674 B1 | 6/2001 | Kamins et al. | |
| 6,359,288 B1 | 3/2002 | Ying et al. | |
| 6,656,573 B2 | 12/2003 | Chen et al. | |
| 6,699,779 B2 | 3/2004 | Chen et al. | |
| 6,808,605 B2 | 10/2004 | Lee et al. | |
| 6,831,017 B1 | 12/2004 | Li et al. | |
| 6,841,013 B2 | 1/2005 | Weiner et al. | |
| 6,843,902 B1 | 1/2005 | Penner et al. | |
| 7,018,549 B2 * | 3/2006 | Metz et al. | 216/2 |
| 2003/0189202 A1 * | 10/2003 | Li et al. | 257/14 |
| 2004/0005723 A1 | 1/2004 | Empedocles et al. | |
| 2004/0082178 A1 | 4/2004 | Kamins et al. | |
| 2004/0144970 A1 | 7/2004 | Wang et al. | |
| 2005/0011431 A1 * | 1/2005 | Samuelson et al. | 117/40 |
| 2005/0029678 A1 | 2/2005 | Hanrath et al. | |
| 2005/0133476 A1 * | 6/2005 | Islam et al. | 216/2 |
| 2006/0175601 A1 * | 8/2006 | Lieber et al. | 257/19 |

OTHER PUBLICATIONS

Ted Kamins, The Electrochemical Society, Interface, Spring 2005, pp. 46-49.*
Wu, Yiying et al., "Block-by-Block Growth of Single-Crystalline Si/SiGe Superlattice Nanowires," Nano Lett., vol. 2, No. 2, pp. 83-86, 2002.

* cited by examiner

*Primary Examiner*—Nadine Norton
*Assistant Examiner*—Maki Angadi

(57) ABSTRACT

A method for selectively controlling lengths of nanowires in a substantially non-uniform array of nanowires includes establishing at least two different catalyzing nanoparticles on a substrate. A nanowire from each of the at least two different catalyzing nanoparticles is substantially simultaneously grown. At least one of the nanowires has a length different from that of at least another of the nanowires.

25 Claims, 5 Drawing Sheets

METHOD FOR SELECTIVELY CONTROLLING LENGTHS OF NANOWIRES

STATEMENT REGARDING FEDERALLY SPONSORED RESEARCH OR DEVELOPMENT

This invention was made in the course of research partially supported by the Defense Advanced Research Projects Agency, Agreement No. MDA972-01-3-0005. The U.S. government has certain rights in the invention.

BACKGROUND

The present disclosure relates generally to nanowire arrays, and more particularly to forming a substantially non-uniform array of nanowires.

Nanowires are generally formed in uniform arrays because nanowires to date have been known to grow at the same rate when the nanoparticles catalyzing the nanowires are of uniform size. Extensive effort has been expended to form nanoparticles with a narrow size distribution so that the properties of the nanowires in an array are uniform. In some instances, however, an array of nanowires with lengths that vary in a controlled manner from one nanowire to another are desired. In order to achieve non-uniform arrays, the lengths of selected large (at least micron scale) regions of nanowires are reduced to a desirable size by, for example, etching or oxidation followed by etching. These additional steps may add to the complexity and expense of the formation process.

As such, it would be desirable to provide a method for forming a non-uniform array of nanowires during nanowire growth, where the method allows for selective control of individual nanowire growth rate, length, and diameter.

SUMMARY

A method for selectively controlling lengths of nanowires in a substantially non-uniform array of nanowires is disclosed. The method includes establishing at least two different catalyzing nanoparticles on a substrate. A nanowire from each of the at least two different catalyzing nanoparticles is substantially simultaneously grown. At least one of the nanowires has a length different from that of at least another of the nanowires.

BRIEF DESCRIPTION OF THE DRAWINGS

Features and advantages of the present disclosure will become apparent by reference to the following detailed description and drawings, in which like reference numerals correspond to similar, though not necessarily identical components. For the sake of brevity, reference numerals or features having a previously described function may not necessarily be described in connection with other drawings in which they appear.

DETAILED DESCRIPTION

Embodiment(s) of the method disclosed herein advantageously allow for the substantially controlled formation of non-uniform nanowires. Without being bound to any theory, it is believed that the nanowire growth rate is at least partially dependent upon the size and/or composition of the catalyzing nanoparticle. As such, by varying the catalyzing nanoparticles used, the growth rate and length of each of the nanowires may be individually controlled.

It is to be understood that various other factors may advantageously be altered so that formation of the nanowires is selectively controllable. One other factor that may be varied is the determination of the x, y coordinates at which the different nanoparticles are established. For example, two different sized catalyzing nanoparticles may be placed at different predetermined x and y coordinates with nanoscale precision (e.g. less than about 100 nm) on a substrate so that each of the nanowires (having selectively controllable, different lengths in the z-axis) is grown in a desirable, predetermined location. As such, the method allows one to control at which x, y coordinates a nanowire of a desirable length (z-coordinate) will be formed.

Still another factor that may be varied to allow control over nanowire formation is the technique used to establish the nanoparticles. Different methods (discussed hereinbelow) may result in different nanoparticle sizes, which will alter the size and growth rate of the nanowires.

Further, the nanowires formed by the method(s) disclosed herein may advantageously exhibit desired/predetermined optical properties, electrical properties, and the like (non-limitative examples of which include size-controlled electrical conductivity, light-guiding properties, increased sensitivity, etc.). As such, the substantially non-uniform arrays 10 may be used in optical applications (a non-limitative example of which includes nanophotonics), electronic applications, sensor applications, and the like. Some non-limitative examples of sensor applications include gas sensors, chemical sensors, bio-sensors, and/or the like.

Figure 1:
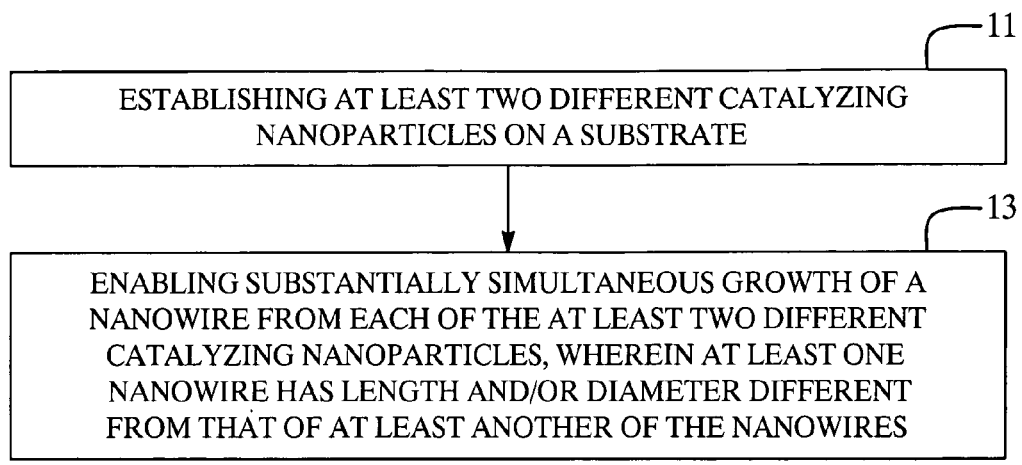
FIG. 1 is a flow diagram depicting an embodiment of the method.

Referring now to FIG. 1, an embodiment of the method of forming a non-uniform array of nanowires is disclosed. Generally, an embodiment of the method includes establishing at least two different catalyzing nanoparticles on a substrate, as depicted at reference numeral 11. The catalyzing nanoparticles enable substantially simultaneous growth of a nanowire from each of at least two different catalyzing nanoparticles, as depicted at reference numeral 13. At least one of the nanowires has a length and/or a diameter different from that of at least one other of the nanowires. It is to be understood that the method will be disclosed herein in more detail in reference to FIGS. 2 through 6C.

Figure 2:
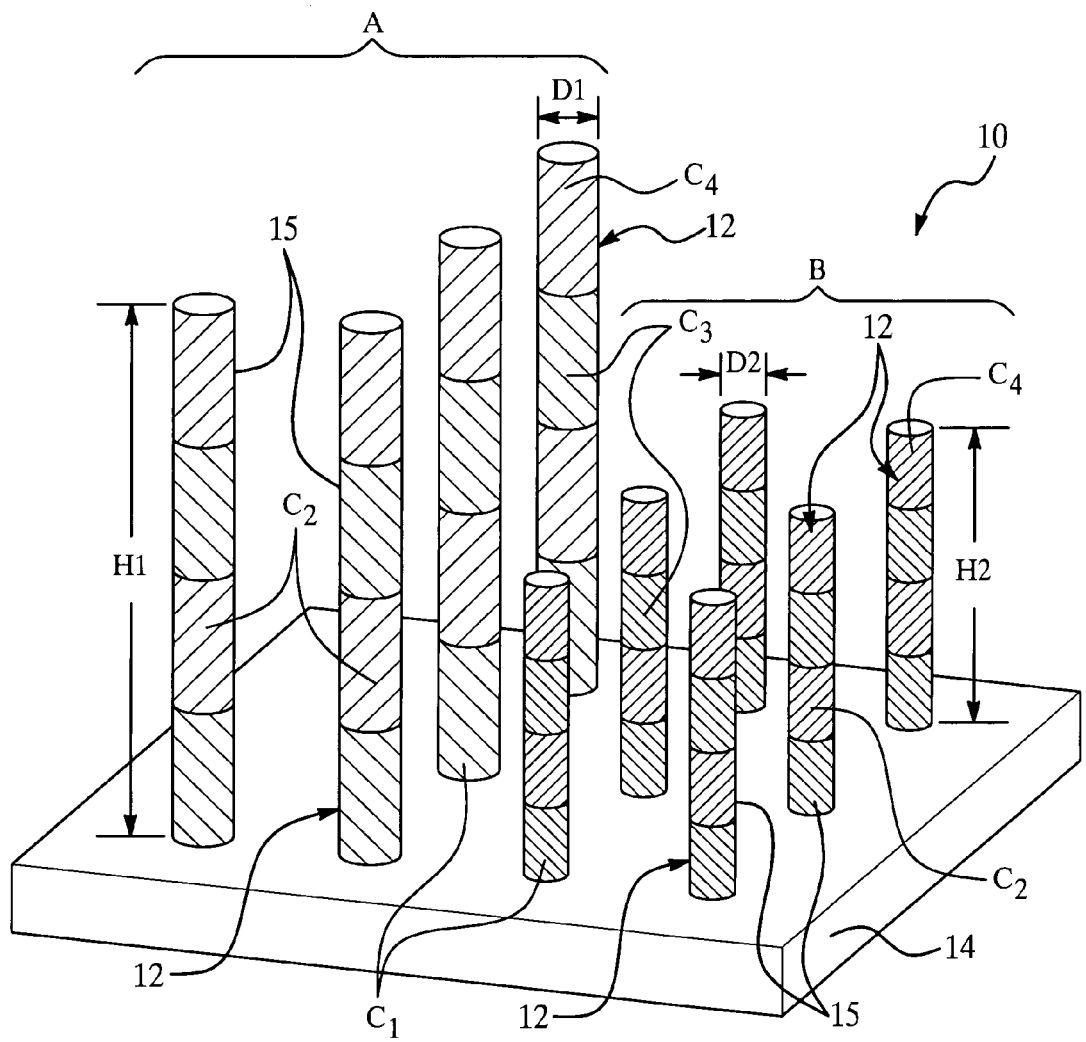
FIG. 2 is a perspective schematic view of an embodiment of a substantially non-uniform array of nanowires.

Referring now to FIG. 2, an embodiment of a substantially non-uniform array 10 of nanowires 12 is depicted. As shown, a plurality of nanowires 12 is formed on a substrate 14. Any suitable substrate 14 may be used, and in an embodiment, the substrate 14 is a silicon wafer. Other non-limitative examples of suitable substrate materials include silicon dioxide, silicon-on-insulator (SOI), alumina, quartz, fused silica, germanium, compound semiconductors (e.g., InP, GaAs, etc.), glass materials (e.g., those capable of withstanding temperatures greater than about 300° C.), electronic circuitry (e.g., integrated circuits) or the like, or combinations thereof. It is to be understood that the substrate 14 may also have one or more layers established thereon.

Figures 3A, 3B, 3C:
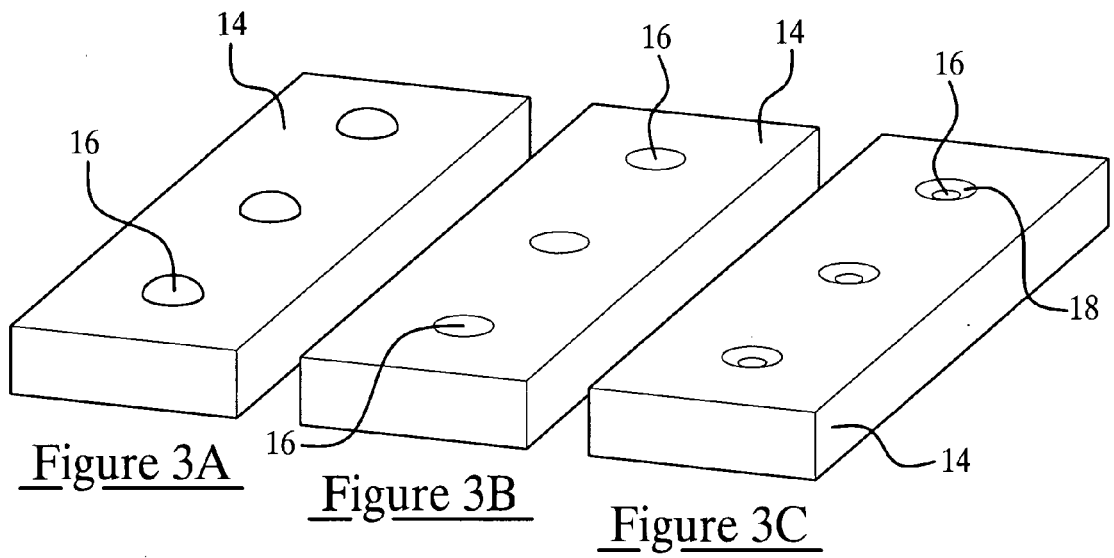
FIG. 3A is a perspective schematic view of an embodiment of a substrate having a plurality of catalyzing nanoparticles established thereon.
FIG. 3B is a perspective schematic view of an embodiment of a substrate having a plurality of catalyzing nanoparticles established substantially level with a surface of a substrate.
FIG. 3C is a perspective schematic view of an embodiment of a substrate having a plurality of depressions defined therein and a plurality of catalyzing nanoparticles established within the depressions.

Embodiments of the substrate 14 (without grown nanowires 12) are depicted in FIGS. 3A through 3C. In the embodiments shown in. FIGS. 3A through 3C, the substrates 14 have a plurality of catalyzing nanoparticles 16 established thereon or therein. In FIG. 3A, the catalyzing nanoparticles 16 are established on, and are substantially raised from the surface of the substrate 14. In FIG. 3B, the catalyzing nanoparticles 16 are established on, or in the substrate 14 surface such that they are substantially level with the surface. In FIG. 3C, the catalyzing nanoparticles 16 are established in depressions 18 formed in the substrate 14 surface.

It is to be understood that the catalyzing nanoparticles 16 may be established on (see FIG. 3A), or substantially level with (see FIG. 3B), the substrate surface via a variety of techniques. In an embodiment, the catalyzing nanoparticles 16 are established by imprinting the nanoparticles 16 via an imprint device (e.g., a mold or a stamp) having regions of catalyzing material that correspond with the catalyzing nanoparticles 16. In this embodiment, the catalyst material is placed on selected, nano-scale regions of the imprint device, and is transferred to the substrate 14 from the device. As such, the size and/or shape of the nanoparticle 16 may be selectively controlled using nanoimprinting.

In another embodiment, the imprint device has regions of a binding material (e.g., an adhesive material) that is capable of binding a subsequently established catalyst material. In this embodiment, the binding material is transferred from the imprint device to the substrate 14. The binding material adheres the catalyst material to the substrate 14, thereby forming the catalyzing nanoparticles 16.

In still another embodiment, a sacrificial layer (e.g. a masking layer, a resist layer, and/or the like) is established on the substrate 14, and a nanoimprinted pattern is formed in the sacrificial layer. The nanoimprinted pattern includes a plurality of depressions, which generally expose various portions of the substrate 14. A catalyst material is deposited such that it contacts the exposed substrate portions. The sacrificial layer is selectively removed, and the catalyst material remains on the substrate 14.

In another embodiment, the substrate 14 is covered with a thin layer of catalyst material and a subsequent layer of masking material. Imprint lithography patterns the masking layer so that it remains and protects the regions that will become the catalyst regions. The catalyst is etched from the remaining regions, and the masking material is removed, leaving the catalyst nanoparticles 16 on the substrate 14. It is to be understood that imprint lithography may be accomplished on the nano- or a larger (e.g. micron) scale.

The catalyzing nanoparticles 16 may be established by establishing a catalyst material on the substrate 14, a layer of non-catalyst material on the catalyst material, and then a sacrificial layer on the non-catalyst material. The sacrificial layer may be patterned via imprint lithography so that regions of the sacrificial layer are removed where nanoparticles 16 are desirable. The non-catalytic layer is etched in these regions, thus exposing the catalyst. The catalyst material in these regions acts as the catalyzing nanoparticles 16 for nanowire 12 growth.

In another embodiment, the substrate 14 has a plurality of depressed regions 18 defined therein. The regions 18 may have different widths, depths, shapes, and/or combinations thereof. A catalyst material may be established on the substrate 14 and in the depressed regions 18. The excess catalyst material may then be removed via chemical mechanical planarization (CMP) such that the material remains in the depressions 18. In an embodiment, the size and shape of the catalyst material within the depressed region 18 is substantially determined by that region's width, depth, and/or shape. As such, the width, depth, and/or shape of each of the depressed regions 18 may be controlled so that desirable catalyzing nanoparticles 16 and nanowires 12 are formed.

Still other methods of establishing the catalyzing nanoparticles 16 include agglomeration of a thin catalyst material during heat treatment, strain-induced self-assembly, or deposition of pre-formed catalyst nanoparticles 16.

The catalyzing nanoparticles 16 may be formed on the substrate 14 in any desirable pattern. A predetermined pattern may be determined, at least in part, by the final application in which the array 10 is to be used, the desired size of each of the nanowires 12, the size of the substrate 14, the size of the nanoparticles 16, the imprinting process parameters, and/or the like, and/or combinations thereof.

It is to be understood that any suitable catalyzing nanoparticles 16 may be selected. Non-limitative examples of suitable catalyzing nanoparticles 16 include gold, titanium, platinum, palladium, nickel, and/or combinations thereof. The nanoparticles 16 may have any desirable size, shape, composition, or combination thereof.

The nanowires 12 are substantially simultaneously grown from the catalyzing nanoparticles 16. It is to be understood that supplying heat and precursor gases of the material(s) forming the nanowires 12 may be used to initiate growth of the nanowires 12 at an area between the substrate 14 and the nanoparticles 16. Alternately, growth may be initiated by supplying atoms of the materials that form the nanowires 12 (e.g. by laser ablation).

As previously indicated, it is believed that the size and/or shape of the catalyzing nanoparticles, advantageously determines, at least in part, the size (e.g. the length in the z-direction and/or diameter) of the resulting nanowire. As such, the growth rate of the nanowires 12 may be selectively controlled by selecting or forming desirable catalyzing nanoparticles.

Referring back to FIG. 2, first set A of the nanowires 12 has a first height (or length) H1 and a first diameter D1, and a second set B of the nanowires 12 has a second height (or length) H2 and a second diameter D2. In this embodiment, growth of the nanowires 12 of first set A initiated by nanoparticles 16 of one size and/or composition takes place at a first rate; while growth of the nanowires 12 of second set B initiated by nanoparticles 16 of another size and/or composition takes place at a second rate. In this embodiment, the nanoparticle(s) 16 selected for the first set A results in a faster nanowire growth rate than the nanoparticle(s) 16 selected for the second set B.

FIG. 2 also depicts the nanowires 12 having a plurality of different compositions throughout the nanowire 12. At different times during the nanowire 12 growth, the nanoparticles 16 and/or nanowires 12 may be exposed to different precursor gases to change the composition of some or all of the nanowires 12. In this embodiment, each of the nanowires 12 has a segment 15 of composition $C_1$, a segment 15 of composition $C_2$, a segment 15 of composition $C_3$, and a segment 15 of composition $C_4$ (and so on up to $C_n$, where n is any integer). It is to be understood that the composition of the nanowires 12 may be transitioned as many times as desirable throughout and/or after the growth process. Thus, a variety of compositions may be chosen for the growing or grown nanowires 12 with nanoscale precision in the z-direction.

It is to be understood that the composition transition may occur at different heights on each nanowire 12, as at least two of the nanowires 12 have different growth rates. This is illustrated in FIG. 2 where the first composition C1 of the nanowires 12 in the first set A has a greater height than the first composition C1 of the nanowires 12 in the second set B. Furthermore, the nanowires 12 may be doped during and/or after growth.

In another embodiment, each nanowire 12 may have a different composition than each of the other nanowires 12. In still a further embodiment, the nanowires 12 may all have the same or similar compositions. It is to be understood that generally the precursor gas determines the nanowire 12 composition. In an embodiment, however, the catalyst may be incorporated into the nanowire 12, thus potentially altering the composition. In another embodiment, different catalyst materials may catalyze the decomposition of each gas in a mixture of precursor gases at a different rate, therefore, the composition of the nanowire 12 may be dependent upon the catalyst materials used.

Figure 4:
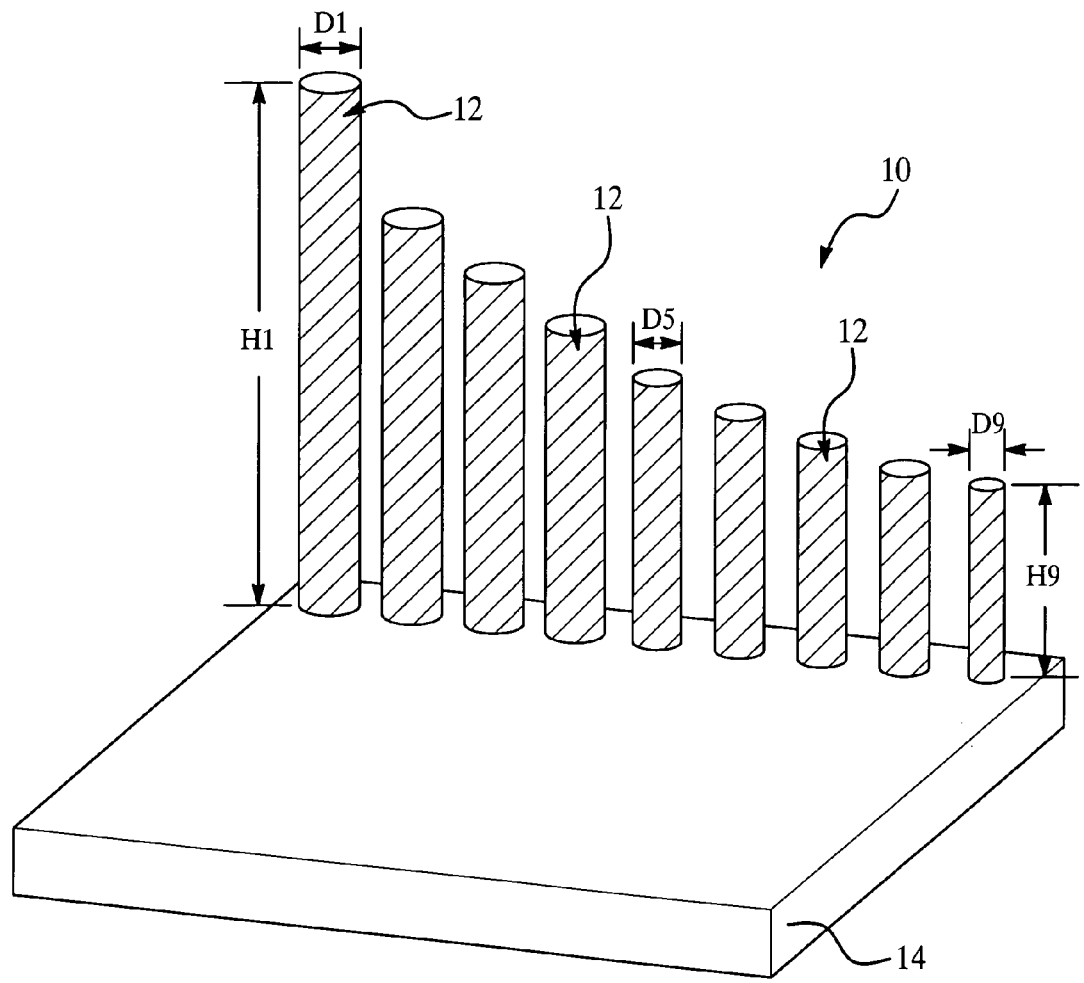
FIG. 4 is a perspective schematic view of an alternate embodiment of a substantially non-uniform array of nanowires.

Referring now to FIG. 4, an alternate embodiment of the substantially non-uniform array 10 of nanowires 12 is shown. Each of the nanowires 12 in this embodiment has a different length/height $H_x$ (in the figure, x=1 through 9) and a different diameter $D_x$ than each of the other nanowires 12. It is to be understood that a plurality of nanoparticles 16 is established on the substrate 14 to form such an array 10. It is to be further understood that each of the nanoparticles 16 is different from the other of the nanoparticles 16, such that each formed nanowire 12 is unique.

Figure 5:
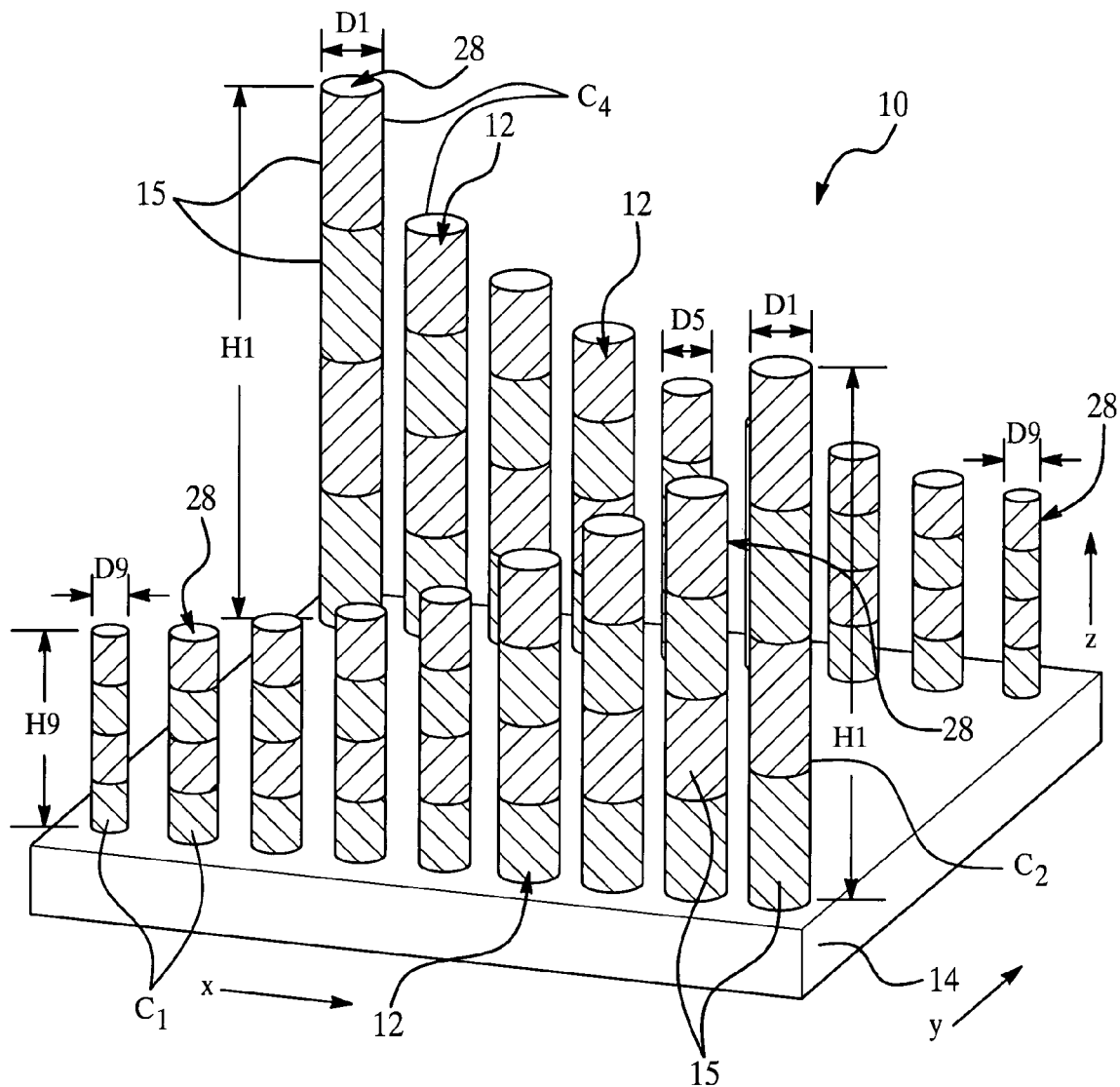
FIG. 5 is a perspective schematic view of still another embodiment of a substantially non-uniform array of nanowires.

Referring now to FIG. 5, another embodiment of the substantially non-uniform array 10 of nanowires 12 is shown. In this embodiment, at least two of the plurality of nanoparticles 16 established (prior to nanowire 12 growth) on the substrate 14 are substantially the same. In this particular embodiment of the array 10, eighteen individual nanoparticles 16 are formed on the substrate 14, and nine different nanoparticle sizes are used. As such, each of the eighteen nanowires 12 has substantially the same diameter and length as one of the other seventeen nanowires 12 in the array 10. It is to be understood that while some of the nanowires 12 are substantially identical to others in the array 10, the array 10 remains substantially non-uniform.

FIG. 5 also illustrates how the formation of the nanowires 12 may be controlled to form a desirable structure with positions controlled in the x, y, and z directions. The controlled selection and placement of the nanoparticles 16 results in an array 10 that may be specifically designed (with desirable placement, composition, length, diameter, etc.) for a desired end use. Together, a selected group of segments 15 (e.g. each of the C1's together, each of the C2's together, etc.) of the nanowires 12 may form a predetermined 3-D shape (e.g., two substantially parallel rows of C1, C2, etc. segments 15 having varying heights at opposed ends of the substrate 14). In an embodiment, this 3-D shape may be useful in another structure. In one non-limitative embodiment, the top regions 28 (one of the groups of segments 15) of the nanowires 12 may form a predetermined 3-D shape, as mentioned above. As such, the nanowires 12 may be a means to an end for controlling formation of desirable structures, e.g. structures having desirable shapes, electrical properties, optical properties, and/or chemical properties.

As a further non-limitative example, the nanowires 12 may be grown so that the top regions 28, located at predetermined x and y coordinates on the substrate 14, are in the desirable z coordinate. The nanowire array 10 may be used in a sensor, where the top regions 28 are electrically, chemically, and/or optically active. The shape of the nanowire array 10 may be specifically designed to coordinate with, for example, a sample delivery device.

Figure 6A:
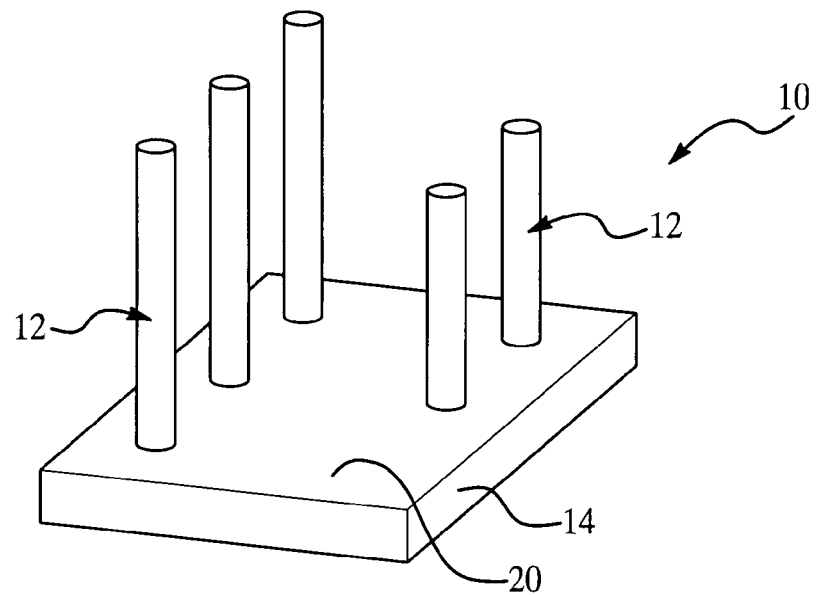
FIGS. 6A through 6D are perspective schematic views depicting the formation of a channel leading to an embodiment of the nanowire array.

Referring now to FIGS. 6A through 6D, some embodiments of forming one or more channel(s) 26 adapted to have fluid flow therethrough are depicted. FIG. 6A depicts a non-uniform array 10 of nanowires 12 on a substrate 14, similar to those previously described. As shown, a portion 20 of the substrate 14 between the nanowires 12 is exposed. It is to be understood that the channel(s) 26 may also be formed with a uniform array of nanowires.

Figure 6B:
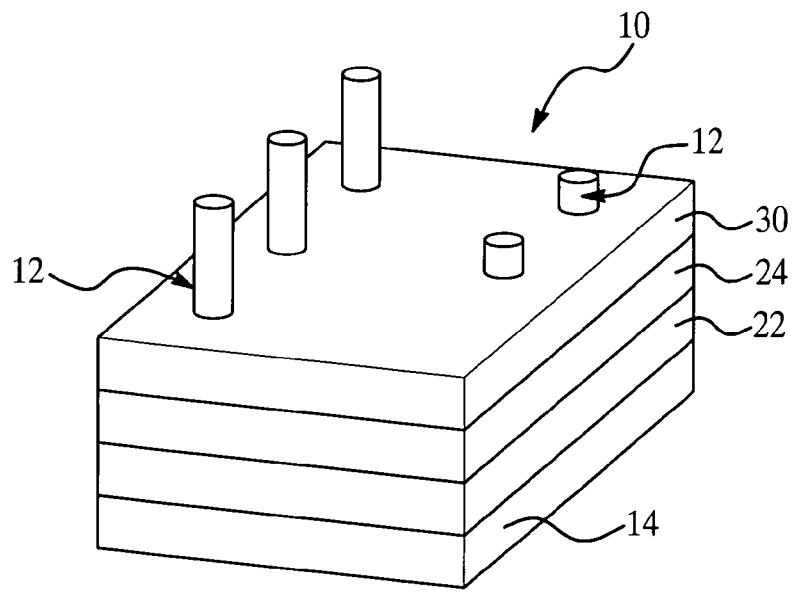

FIG. 6B depicts three layers 22, 24, 30 established on the exposed portions 20 of the substrate 14, such that the layers 22, 24, 30 substantially surround at least some of the nanowires 12.

Figure 6C:
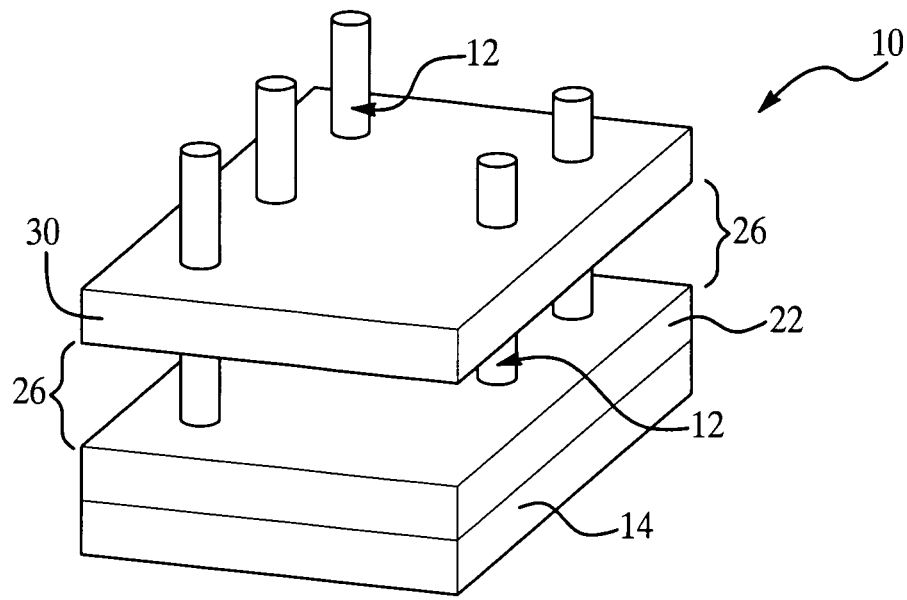
Figure 6D:
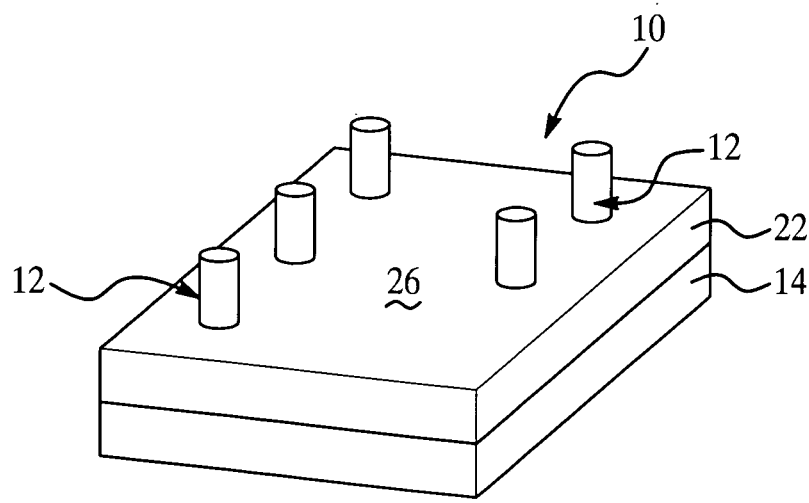

FIG. 6C depicts the selective removal of one of the layers 22, 24, 30 (e.g. layer 24 is shown removed) such that a channel 26 is formed (it is to be understood that channel 26 optionally may be bounded by a single layer, e.g. see FIG. 6D). Selective removal may be accomplished by a chemical etchant, selected to remove the desired layer 22, 24, 30. As depicted, the channel 26 has the array 10 of nanowires 12 extending therethrough. It is to be understood that the channel 26 may be adapted to have fluid (non-limitative examples of which include gases and liquids) flow adjacent the nanowires extending therethrough.

Although three layers 22, 24, 30 (one of which is removed) and one channel 26 are shown, it is to be understood that any number of layers 22, 24, 30 and channels 26 may be formed, as desired. Generally, if "n" layers are formed (where "n" is any number), then up to n/2 layers may be removed to form one or more channels 26. It is to be further understood that such layers 22, 24, 30/channels 26 may be formed around a uniform array of nanowires, or around a substantially non-uniform array 10 of nanowires.

It is to be understood that the growth of the nanowires 12 may be selectively controlled so that each has a predetermined composition extending through the channel 26 and/or so that each individual nanowire 12 exhibits an individual predetermined functionality. In an embodiment, the nanowires 12 exhibit optical, chemical and/or electrical activity.

In one non-limitative embodiment of an application of the nanowire array shown in FIG. 6C, for example, each of the five nanowires 12 may be selectively controlled so that the portion of an individual nanowire 12 extending through the channel 26 is capable of sensing one or more analyte(s) that is/are different from those capable of being sensed by each of the other four individual nanowires 12. As such, in one non-limitative example of the use of array 10, a single array 10 may be exposed to a solution containing a variety of analytes, and multiple analytes within the solution may be detectable.

Referring now to FIG. 6D, a further non-limitative embodiment is depicted. In this embodiment, two layers 22, 24 may be established, as mentioned above. Nanowires 12 of varying lengths extend therethrough. Then, the nanowires 12, with layer 24 acting as a protective layer, are cut to substantially the same length, such as via, for example, chemical mechanical polishing (CMP), or any other suitable process (though layer 24 may be optional if, for example, nanowires 12 substantially do not need protection during CMP). Layer 24, if desired, may then be removed by any suitable process, such as for example, etching It is to be understood that layer 24 may be formed from any suitable sacrificial material, as desired. In this embodiment, nanowires 12 remaining in channel 26 may be capable of detecting the same and/or different analytes of interest. In another embodiment, each of the nanowires 12 may be selectively (i.e. each individual nanowire 12 in this embodiment may be different from another individual nanowire 12; or some 12 may be substantially the same as others 12; or all 12 may be substantially the same) electrically, chemically, and/or optically active.

In all the embodiments disclosed herein, different materials may be established on different nanowires 12 in the array 10. In one embodiment, subsequent to nanowire 12 growth, one or more of the nanowires 12 may be protected or masked such that the unprotected/unmasked nanowires 12 remain exposed. The exposed nanowires 12 may then have a material established thereon.

Alternately, a nanowire 12 may have an additional material established thereon such that a portion of the nanowire 12 has a larger diameter than another portion of the same nanowire 12. In forming this nanowire 12 in the array 10, a portion of the nanowire 12 is selectively masked such that another portion of the same nanowire 12 is exposed. A material is established on the exposed portion, such that that portion has a larger diameter than the rest of the nanowire 12.

In another embodiment, the different diameters are formed by selectively adding materials to selected segments of a nanowire 12. The added material may be formed, for example, by electro- or electroless plating. It is to be understood that the added material may selectively form on a particular segment of the nanowire 12.

It is to be understood that the substantially non-uniform array 10 may be used in any suitable device, including optical devices, electronic devices, and the like. A non-limiting example of such a device includes a superlattice with varying symmetry formed by the method(s) disclosed herein. Nanowires 12 with segments of varying length formed by the method(s) described herein may also be used to form optical sensors using enhanced Raman spectroscopy. The binding of the molecules to be analyzed by the enhanced Raman technique depends on the length of the segments (e.g., the length of the inactive segment separating active segments). Different nanowires 12 (or groups of nanowires 12) with different length segments may, therefore, be sensitive to different molecules, allowing the species, as well as the concentration, to be determined.

While several embodiments have been described in detail, it will be apparent to those skilled in the art that the disclosed embodiments may be modified. Therefore, the foregoing description is to be considered exemplary rather than limiting.

What is claimed is:

1. A method for selectively controlling lengths of nanowires in a substantially non-uniform array of nanowires, the method comprising:
    establishing at least two different catalyzing nanoparticles on a substrate; and
    substantially simultaneously growing a nanowire from each of the at least two different catalyzing nanoparticles, wherein at least one of the nanowires has a length different from that of at least an other of the nanowires.

2. The method as defined in claim 1, further comprising selectively controlling a rate of growth of each of the at least one nanowire and the at least an other nanowire.

3. The method as defined in claim 1, further comprising selectively controlling the length of each of the at least one nanowire and the at least an other nanowire.

4. The method as defined in claim 1 wherein establishing the at least two different catalyzing nanoparticles on the substrate is accomplished by imprinting the at least two different catalyzing nanoparticles on the substrate via an imprint device having regions of catalyzing material that correspond with the at least two different catalyzing nanoparticles.

5. The method as defined in claim 1 wherein establishing the at least two different catalyzing nanoparticles on the substrate is accomplished by:
    selectively transferring a binding material to the substrate; and
    selectively adhering catalyst material to the binding material.

6. The method as defined in claim 1 wherein establishing the at least two different catalyzing nanoparticles on the substrate is accomplished by:
    establishing a layer of catalyst material on the substrate;
    establishing a protective layer over the catalyst material layer such that at least a region of the catalyst material layer remains exposed;
    removing the exposed region of the catalyst material layer; and
    removing the protective layer.

7. The method as defined in claim 1 wherein establishing the at least two different catalyzing nanoparticles on the substrate is accomplished by strain-induced self-assembly.

8. The method as defined in claim 1 wherein the substrate has a plurality of depressed regions defined therein and wherein establishing the at least two different catalyzing nanoparticles on the substrate is accomplished by:
    depositing a catalyst material on the substrate and in the plurality of depressed regions; and
    removing the catalyst material via chemical mechanical planarization such that catalyst material remains in the plurality of depressed regions.

9. The method as defined in claim 8 wherein the plurality of depressed regions has at least one of different widths, different heights, and combinations thereof.

10. The method as defined in claim 1 wherein establishing the at least two different catalyzing nanoparticles on the substrate is accomplished by:
    establishing a sacrificial layer on the substrate;
    forming a plurality of depressions in the sacrificial layer, thereby exposing portions of the substrate; and
    establishing catalyzing material in at least some of the plurality of depressions.

11. The method as defined in claim 1 wherein establishing the at least two different catalyzing nanoparticles on the substrate is accomplished by:
    establishing a catalyst material on a substrate;
    establishing a non-catalyst material over the catalyst material;
    establishing a mask over the non-catalyst material; and
    removing at least a portion of the mask and the non-catalyst material, thereby exposing at least a portion of the catalyst material.

12. The method as defined in claim 1 wherein the at least two different catalyzing nanoparticles have at least one of different sizes, different shapes, different compositions, and combinations thereof.

13. The method as defined in claim 1 wherein a portion of the substrate is exposed between individual nanowires in the substantially non-uniform array of nanowires, and wherein the method further comprises:

establishing at least two layers on the exposed portion of the substrate; and selectively removing at least one of the at least two layers such that at least one channel is formed, the channel having the substantially non-uniform array of nanowires extending therethrough.

14. The method as defined in claim 13 wherein the channel is adapted to have a fluid flow adjacent the substantially non-uniform array of nanowires extending therethrough.

15. The method as defined in claim 1 wherein the at least one of the nanowires grows at a first rate and wherein the at least the other of the nanowires grows at a second rate that is different than the first rate.

16. The method as defined in claim 15 wherein the at least one of the nanowires grows to a first length and wherein the at least the other of the nanowires grows to a second length that is different than the first length.

17. The method as defined in claim 1 wherein subsequent to substantially simultaneously growing the nanowire from each of the at least two different catalyzing nanoparticles, the method further comprises:

selectively masking at least one of the nanowires such that at least the other of the nanowires is exposed; and establishing a material on the exposed nanowire.

18. The method as defined in claim 1, further comprising exposing at least one of the catalyzing nanoparticles or the nanowires to at least two different precursor gases at different times during growing, thereby changing a composition of the nanowire and the other nanowire, and wherein a change in composition of the nanowire occurs at a different length from a change in composition of the other nanowire.

19. The method as defined in claim 1 wherein the at least two different catalyzing nanoparticles are established in a predetermined pattern on the substrate.

20. A method for forming a substantially non-uniform array of nanowires, the method comprising:

establishing a plurality of catalyzing nanoparticles on a substrate, at least two of the plurality of catalyzing nanoparticles being different from each other; and substantially simultaneously growing a nanowire from each of the plurality of catalyzing nanoparticles, wherein the nanowire grown from one of the at least two different catalyzing nanoparticles has at least one of length and diameter different from that of the nanowire grown from an other of the at least two different catalyzing nanoparticles.

21. The method as defined in claim 20, further comprising selectively controlling the rate of growth of each of the at least one nanowire and the at least an other nanowire.

22. The method as defined in claim 20 wherein subsequent to substantially simultaneously growing the nanowire from each of the plurality of catalyzing nanoparticles, the method further comprises selectively coating at least one segment of at least one of the nanowires.

23. The method as defined in claim 22 wherein selectively coating is accomplished by:

selectively masking at least a portion of at least one of the nanowires such that at least an other portion of the at least one of the nanowires is exposed; and establishing a material on the exposed portion of the at least one of the nanowires.

24. The method as defined in claim 22 wherein selectively coating is accomplished by establishing a material on the nanowires, and wherein the material is capable of selectively forming on the at least one segment of the at least one of the nanowires.

25. A method for forming an array of nanowires, the method comprising:

establishing at least two catalyzing nanoparticles on a substrate in a predetermined pattern, a portion of the substrate remaining exposed;

substantially simultaneously growing at least one nanowire from each of the at least two catalyzing nanoparticles;

establishing at least two layers on the exposed portion of the substrate; and selectively removing one of the at least two layers such that a channel is formed, the channel having the array of nanowires extending therethrough.

* * * * *

UNITED STATES PATENT AND TRADEMARK OFFICE
CERTIFICATE OF CORRECTION

PATENT NO. : 7,402,531 B1 Page 1 of 1
APPLICATION NO. : 11/297900
DATED : July 22, 2008
INVENTOR(S) : Philip J. Kuekes et al.

It is certified that error appears in the above-identified patent and that said Letters Patent is hereby corrected as shown below:

In column 7, line 64, in Claim 1, delete "an other" and insert -- another --, therefor.

In column 7, line 67, in Claim 2, delete "an other" and insert -- another --, therefor.

In column 8, line 3, in Claim 3, delete "an other" and insert -- another --, therefor.

In column 10, line 6, in Claim 20, delete "an other" and insert -- another --, therefor.

In column 10, line 10, in Claim 21, delete "an other" and insert -- another --, therefor.

In column 10, line 19, in Claim 23, delete "an other" and insert -- another --, therefor.

Signed and Sealed this

Twenty-third Day of December, 2008

JON W. DUDAS
*Director of the United States Patent and Trademark Office*